United States Patent
Iwamatsu

(10) Patent No.: US 7,011,927 B2
(45) Date of Patent: Mar. 14, 2006

(54) ELECTRON BEAM DUPLICATION LITHOGRAPHY METHOD AND APPARATUS

(75) Inventor: Seiichi Iwamatsu, Nagano (JP)

(73) Assignee: Si Diamond Technology, Inc., Austin, TX (US)

( * ) Notice: Subject to any disclaimer, the term of this patent is extended or adjusted under 35 U.S.C. 154(b) by 0 days.

(21) Appl. No.: 11/040,202

(22) Filed: Jan. 21, 2005

(65) Prior Publication Data

US 2005/0121623 A1    Jun. 9, 2005

Related U.S. Application Data

(62) Division of application No. 09/836,857, filed on Apr. 17, 2001, now Pat. No. 6,849,856.

(51) Int. Cl.
 *G03C 5/00* (2006.01)
 *G21G 5/00* (2006.01)
 *G21K 5/10* (2006.01)

(52) U.S. Cl. .................. 430/296; 430/942; 250/492.2; 250/492.22; 250/492.3

(58) Field of Classification Search ............... 430/296, 430/942; 250/492.2, 492.22, 492.3
See application file for complete search history.

(56) References Cited

U.S. PATENT DOCUMENTS

| | | | |
|---|---|---|---|
| 4,512,848 A | 4/1985 | Deckman et al. | 156/630 |
| 4,857,161 A | 8/1989 | Borel et al. | 204/192.26 |
| 5,245,248 A | 9/1993 | Chan et al. | 313/309 |
| 5,461,009 A | 10/1995 | Huang et al. | 437/228 |
| 5,743,998 A | 4/1998 | Park | 156/628.1 |
| 5,892,231 A | 4/1999 | Baylor et al. | 250/398 |
| 6,794,666 B1 | 9/2004 | Choi et al. | 250/492.24 |

FOREIGN PATENT DOCUMENTS

JP    2001-118772    4/2001

*Primary Examiner*—Christopher G. Young
(74) *Attorney, Agent, or Firm*—Kelly K. Kordzik; Winstead Sechrest & Minick P.C.

(57) ABSTRACT

An electron beam duplication lithography apparatus and method for focusing electrons emitted from a mask plate as a result of an application of an electric field between a mask plate and a duplication plate. Irradiation of electrons from the mask plate is assisted through an electric field lens or magnetic field lens, or a combination thereof from an electron field emission material formed into a pattern on a flat surface of a substrate. The result is that a congruent or similar pattern is lithographed by electron beam exposure onto an electron beam resist film from a field emission film having the congruent or similar pattern to be created.

10 Claims, 5 Drawing Sheets

ELECTRON BEAM DUPLICATION LITHOGRAPHY METHOD AND APPARATUS

TECHNICAL FIELD

The present invention relates in general to electron beam duplication lithography.

BACKGROUND INFORMATION

Referring to FIG. 4, there is illustrated a prior art apparatus for performing electron beam duplication lithography using a photo cathode. A quartz substrate 41 forms the base of a mask plate 40 on which a chromium (Cr) light shield pattern 42 is formed. On the surface of substrate 41 and between the portions of the Cr light shield pattern 42, a photo cathode film 43 is deposited in a defined pattern. The photo cathode material 43 emits electrons when bombarded by light energy, such as ultra violet light 46. An exemplary photo cathode material is cesium iodide (CsI), which is a low work function material. An ultra violet light source (not shown) irradiates ultra violet light 46 through the backside of quartz substrate 41, bombarding the photo cathode film 43, resulting in a secondary emission of electrons 47 from the photo cathode patterned film 43. The emitted photo electrons 47 are accelerated by an electric field applied by acceleration electric source E, and may be focused into an electron beam 47 by a focusing magnetic field (magnetic field lens) 48 created by magnetic coils (not shown), onto electron beam resist film 45 deposited on substrate plate 44. In this manner, the "lithography" is not created by light but by exposure of the resist film 45 to an electron beam. The result is that the pattern formed by light shield pattern 42 and photo cathode film 43 is duplicated when portions of resist film 45 are bombarded by the electron beams 47. The electron beams change the molecular structure of the resist such that the portion of the resist bombarded by electrons is easy to dissolve in specific chemicals for the resist ("developer" chemicals).

However, there are several disadvantages to the prior art technique illustrated in FIG. 4. Because the mask plate is itself a passive light emission device using a photo cathode, there is a need for an ultra violet lamp. Furthermore, the wave length of ultra violet light is limited to about 0.1 micrometers($\mu$m), and thus, duplication lithography below 0.1 micrometers is very difficult, if not impossible. Additionally, the lifetime of the photo electron plane is limited to a duplication cycle of approximately 50 cycles when using CsI for the photo electron plane. Moreover, although the quartz substrate 41 is quite conductive to ultra violet light, quartz is a relatively expensive material especially in large areas.

Furthermore, it is difficult to achieve a duplication that is precisely one-to-one between the pattern to be duplicated and the pattern that is created, without molding the surface of the photo cathode pattern 43 to be concave, which will result in surface roughness on the concave surface and a duplication that is even still difficult to produce in a one-by-one manner.

SUMMARY OF THE INVENTION

The present invention addressed the foregoing needs by an electron beam duplication lithography apparatus utilizing a field emission cathode for emitting electrons to the electron beam resist film. One advantage of the present invention is that duplication lithography of a fine pattern with features below 0.1 micrometers is possible. Another advantage of the present invention is that a high duplication directivity of one-by-one is achievable. Yet another advantage of the present invention is that it does not require an ultra violet light source, nor a quartz substrate.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
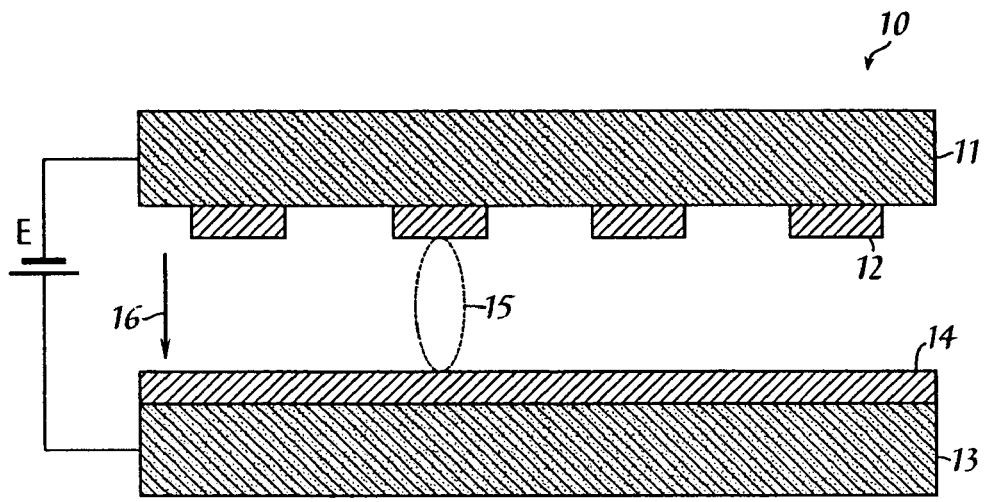
FIG. 1 illustrates an electron beam duplication lithography apparatus configured in accordance with an embodiment of the present invention.

In the following description, numerous specific details are set forth to provide a thorough understanding of the present invention. However, it will be obvious to those skilled in the art that the present invention may be practiced without such specific details.

Refer now to the drawings wherein depicted elements are not necessarily shown to scale and wherein like or similar elements are designated by the same reference numeral through the several views.

In solving needs of the prior art, the present invention provides an electron beam duplication lithography apparatus and method for focusing electrons emitted from a mask plate as a result of an application of an electric field between a mask plate and a duplication plate. Irradiation of electrons from the mask plate is assisted through an electric field lens or magnetic field lens, or a combination thereof from an electron field emission material formed into a pattern on a flat surface of a substrate. The result is that a congruent or similar pattern is lithographed by electron beam exposure onto an electron beam resist film from a field emission film having the congruent or similar pattern to be created.

Because there is no use of a photo cathode, it is possible to realize a longer lifetime of the mask plate. Moreover, it is possible to construct the mask plate using a conductive substrate or having a conductive film coated glass substrate or ceramic substrate or a metal substrate, at a lower cost. Moreover, it is possible to achieve higher current densities with a field emitter, resulting in a lessening of the exposure time of the resist film, resulting in a faster lithography process, which will increase the manufacturing throughput.

Because the mask plate surface is flat, it is possible to more effectively duplicate in a one-to-one manner, plus there is no inherent limit to the size of the cathode. The whole pattern can be exposed in parts of it at a time. It is also possible to realize more precise duplication lithography below the 0.1 micrometer level.

A field emission device can use low work function materials, such as a diamond-like carbon thin film. As a result, the two plates can be positioned closer together resulting in higher current densities, resulting in the increased efficiency, all without a degradation of the mask plate, since the diamond-like carbon thin film is more resistant to damage over its lifetime.

Referring to FIG. 1, there is illustrated a cross-section view of an electron beam duplication lithography apparatus in accordance with an embodiment of the present invention. The apparatus may be operated in a vacuum chamber. The mask plate 10 is a cathode using a substrate 11 with an electron emission device 12 formed in a predetermined pattern on the substrate 11. The substrate 11 could be made from a conductive film coated glass, ceramics, silicon, metal, etc. The electron emission material 12 can be diamond-like carbon (DLC) film, diamond film, carbon film, carbon nanotube (CNT) film, porous silicon film, or any other field emission material. Furthermore, though the surface of the material is relatively flat, the present invention should not be limited to exclude micro-tip and other projection-like features of the field emission material. In this example, electron beams 15 emit from the plural patterned field emission devices 12 connected to the cathode electrode, and are focused to irradiate onto electron beam resist film 14 on duplicated plate 13. In one exemplary embodiment of the present invention, the mask plate 10 and the duplicated plate are in parallel with each other and separated between 50 micrometers and five millimeters apart. The substrates 11 and 13 may be conductive, or conductive films may be deposited thereon in order that an exemplary applied voltage from one kilovolt to ten kilovolts can be provided for promotion of emission of electrons from the electron emission device 12 toward the electron beam resist film 14. A magnetic lens (focusing magnetic field) 16 is formed parallel to the electron beams 15 to focus the electron beams 15 as they are irradiated toward the electron beam resist film 14. The magnetic field 16 may be created by any well known means. The magnitude of the magnetic field may be a function of the gap between the two plates and the field strength of the electrical field.

The result of the apparatus in FIG. 1 is that an electron emission type plate is provided that is self-emitting of electrons and the field emission device 12 is planar and patterned to thereby etch a duplicated pattern into the electron beam resist film 14.

As noted, to assist in preventing spreading of emitted electrons, the electron beam 15 can be focused with a magnetic field 16, but it is also possible to use an electric field lens. Also, some type of grid electrode can also be utilized to focus the electron beams 15. Further, it is possible to have a better defined pattern into the electron beam resist material 15 by placing the plates closer together, which can also result in a lowering of the voltage needed to create the acceleration voltage E. In this case, if needed, exposure of the resist film 14 on substrate 13 can be formed in sections over the entire substrate surface.

Figure 2:
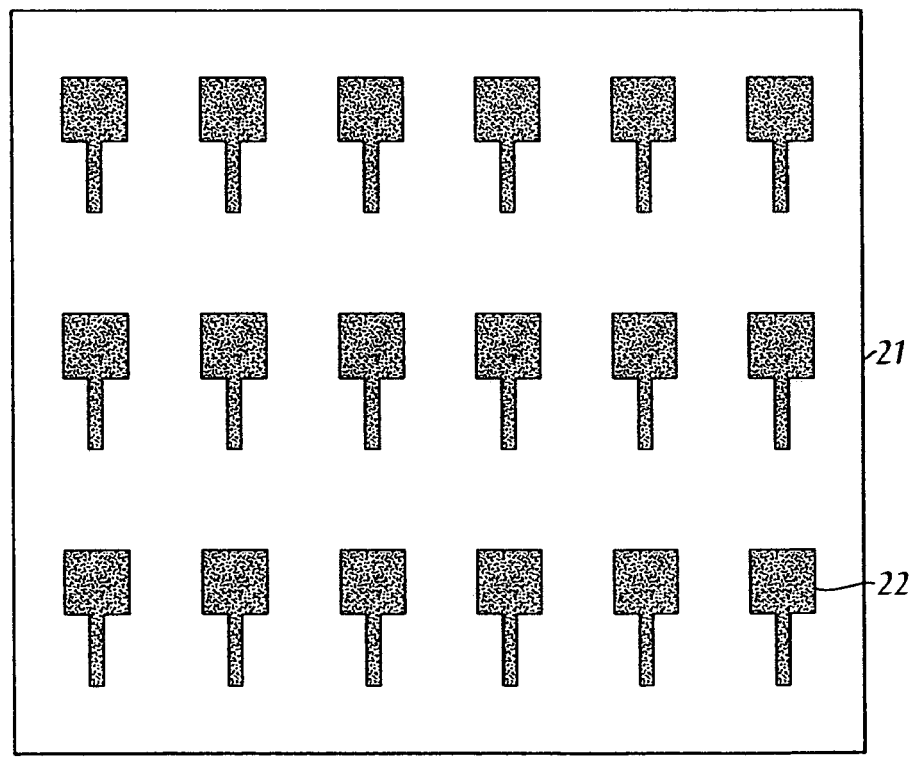
FIG. 2 illustrates an exemplary duplicated pattern created by an embodiment of the present invention.

FIG. 2 illustrates an exemplary duplicated pattern lithographed in accordance with an embodiment of the present invention by electron beam duplication lithography, such as using the apparatus illustrated in FIG. 1. On the duplicated plate 21 is a pattern 22 where the resist material 14 has been patterned by electron beam lithography from an electric field emission device 12. Such electric field emission device 12 will have the same pattern as the keyhole pattern 22 shown in FIG. 2. In FIG. 2, the exemplary duplicated pattern 22 is arranged in an array, but a more complex shaped pattern is possible using the present invention. Furthermore, inner circuitry can be formed different from circuitry around the periphery of the plate 21.

The lithograph time t is defined by the emission current density J and the sensitivity S of the electron beam resist material used 14 as follows:

$$t = S/J$$

For example, when J is equal to 10 mA/cm$^2$, and the electron beam resist material 14 has a sensitivity of 10 to 100 micro-Coulombs/cm$^2$, for a one-to-one duplication lithography, it is possible to perform such a process in 10 milliseconds.

Figure 3:
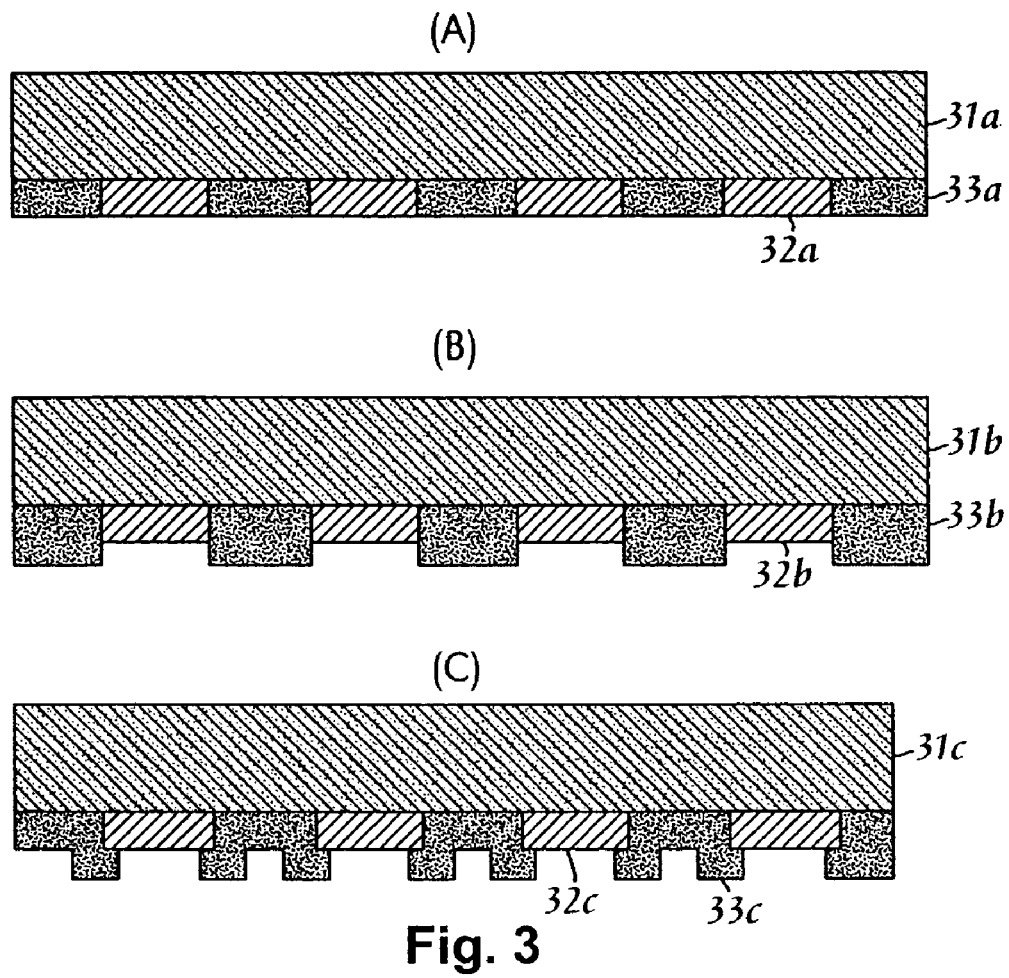
FIGS. 3A, 3B, and 3C illustrate an alternative embodiment of the present invention.
Figure 4:
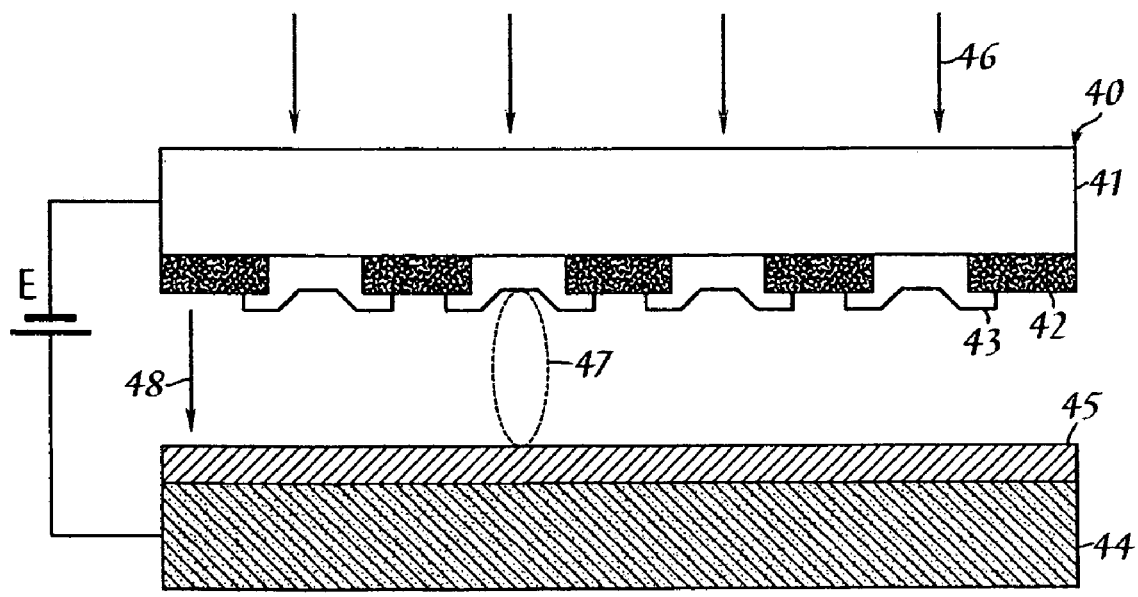
FIG. 4 illustrates a prior art electron beam duplication lithography apparatus.

FIGS. 3A, 3B, and 3C show cross-sections of alternative embodiments of the mask plate 10 shown in FIG. 1. The exemplary mask plate illustrated in FIG. 3A shows that the patterned field emission material 32a is formed with a dielectric or conducive material 33a onto substrate 31a where the surfaces of layers 32a and 33a are substantially coplanar. In FIG. 3B, the patterned field emission material 32b is recessed so that its top surface is lower than the top surface of the dielectric or conductive material 33b.

In FIG. 3C, the field emission material 32c is patterned onto substrate 31c, and the dielectric or conductive material is then coated in between the patterned field emission material 32c and over its edges to cover the edged portions of the electric field emission device 32c. Note, it is also possible to merely coat a single layer of field emission material 32c onto substrate 31c, and then to realize the effective pattern of the field emission from gaps through the dielectric or conductive material 33c.

The buried layers 33a, 33b, and 33c function to assist by concentrating the electrons emitted from the field emission material because the sidewalls are at least coated by the conductive or dielectric material. The reason is that otherwise, the edges of the field emission devices 32a, 32b, and 32c will more readily yield electron emissions resulting in a corresponding decrease in electron emissions from the non-edged portions. This may result in non-uniformity of the emission of electrons. However, with the methods illustrated in FIGS. 3A, 3B and 3C, it is possible to suppress the irregular lithography by realizing an improvement in the uniform emission of electrons from the entire field emission material that is unexposed.

With the electron beam lithography of the present invention, it is possible to realize high resolution lithography, lithography of a pattern having features below 0.1 micrometers, and improved productivity with a quicker lithography process, and a focus depth of +/−15 micrometers.

Figure 5A:
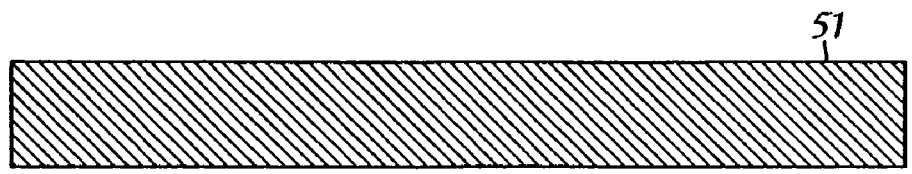
FIGS. 5A–5L illustrate a process for creating a mask plate in accordance with the present invention.
Figure 5B:
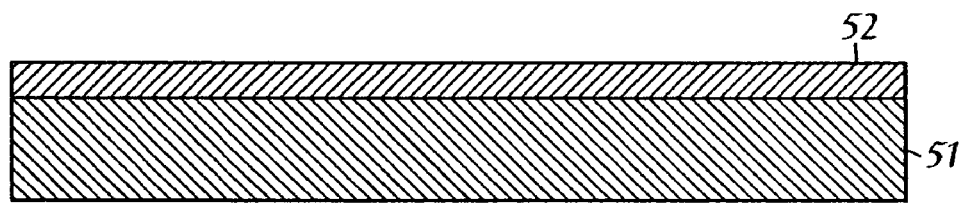
Figure 5C:
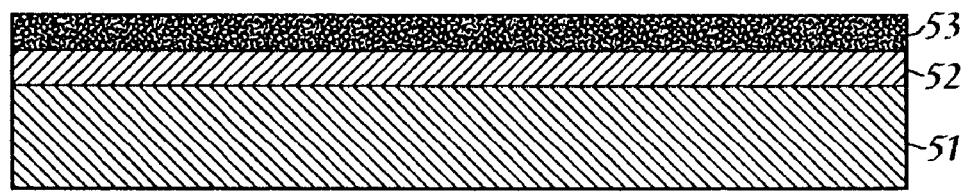
Figure 5D:
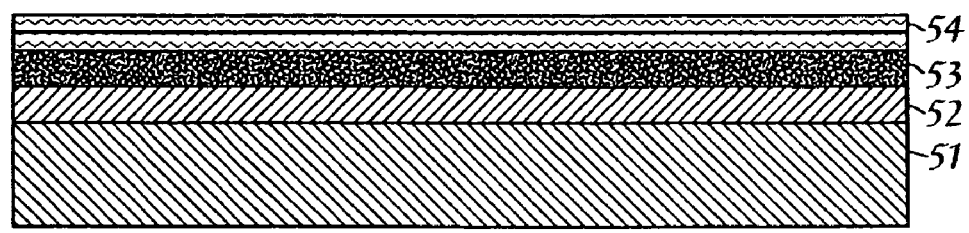
Figure 5E:
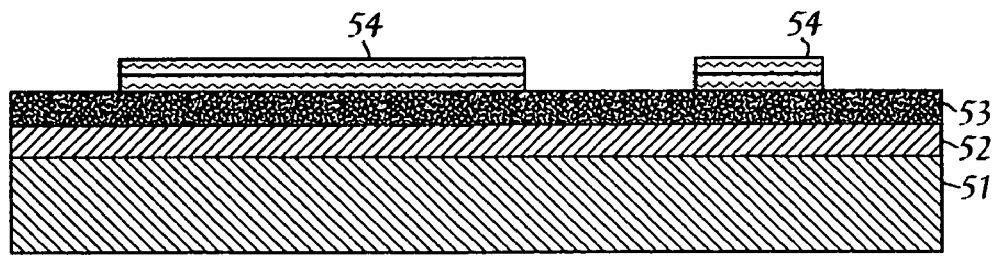

Referring to FIGS. 5A–5L there is illustrated a process for creating a mask plate, such as the mask plates illustrated in FIGS. 1 and 3A–3C. In FIG. 5A, a substrate 51 is provided. In FIG. 5B, an indium tin oxide (ITO) layer 52 is deposited onto substrate 51. In FIG. 5C, a field emitter material 53 is deposited onto the ITO layer 52. In FIG. 5D, an electron-beam sensitive or photosensitive resist layer 54 is deposited onto the field emitter layer 53. In FIG. 5E, the resist material 54 is exposed by an E-beam or light with pattern and developed to form a patterned layer of resist 54. Note, an alternative approach may be to deposit a hard-mask layer on top of the field emitter material 53, then deposit the resist material, then expose the resist material then develop it to then etch the hard-mask layer. The resist is then removed leaving a structure that is the same as above, except that the top layer is a hard-mask layer and not a resist material. Such a hard-mask layer could be used to withstand a harsh etch of oxygen plasma.

Figure 5F:
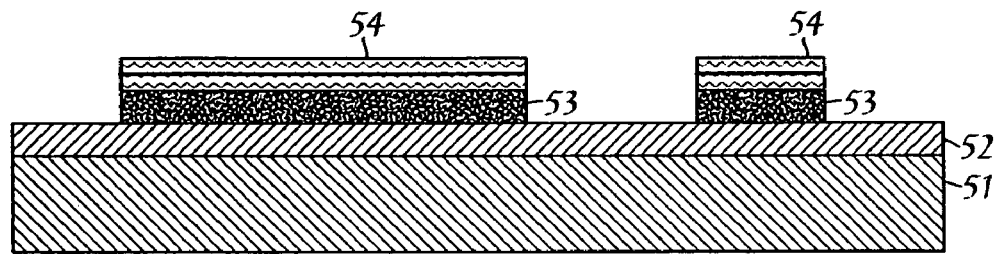
Figure 5G:
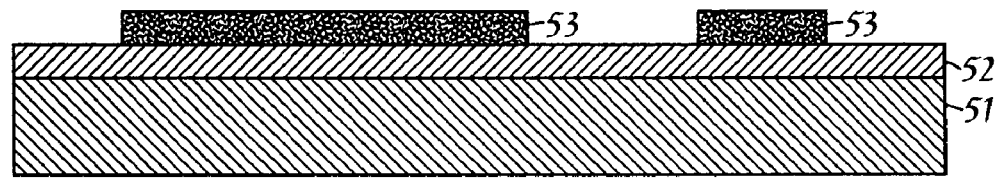
Figure 5H:
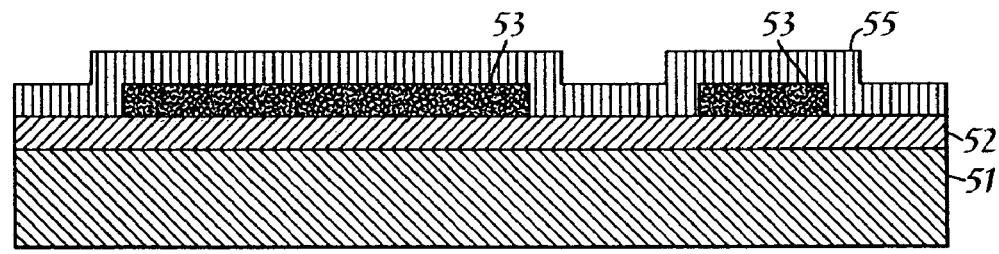
Figure 5I:
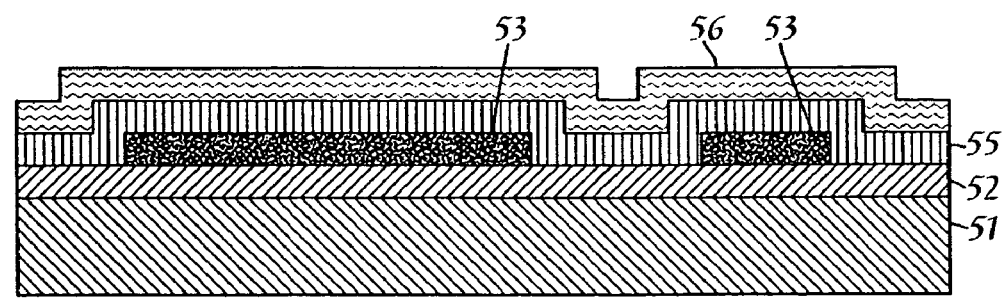
Figure 5J:
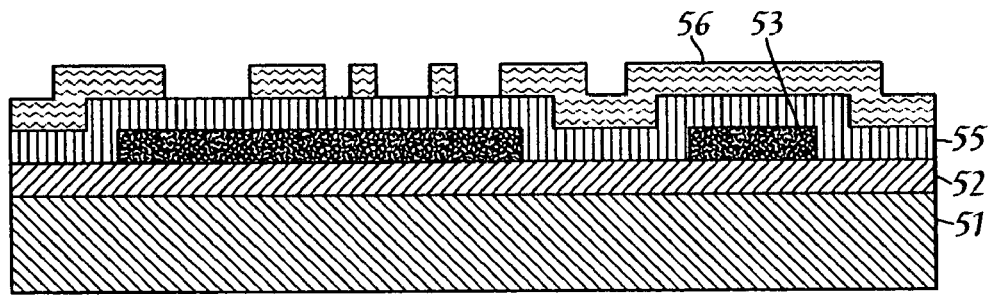
Figure 5K:
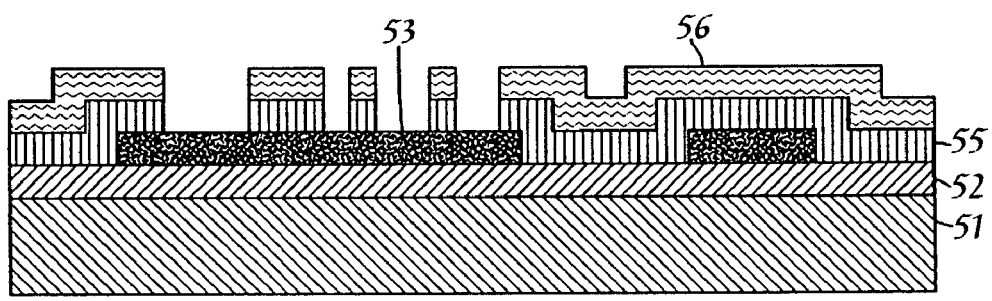
Figure 5L:
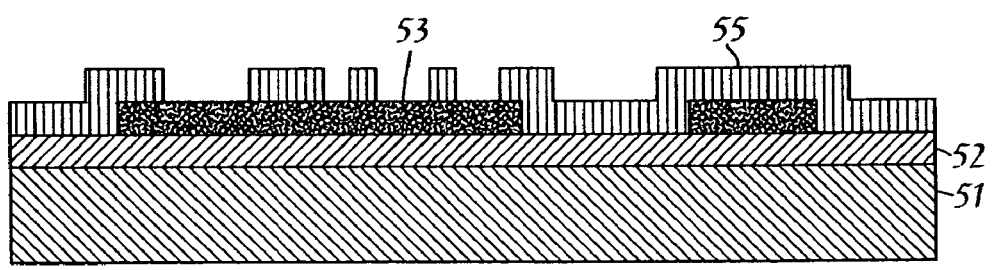

In FIG. 5F the field emitter material 53 is etched in oxygen plasma. In FIG. 5G, the resist material (or hand-mask layer) 54 is removed. In FIG. 5H, a layer of silicon dioxide (SiO$_2$) is deposited on top of the field emitter 53 and ITO 52 layers. In FIG. 5I, an E-beam sensitive resist layer 56 is deposited onto the silicon dioxide layer 55. In FIG. 5J, the E-beam resist layer 56 is pattern exposed to an electron beam, developed and patterned using standard techniques in the photo mask industry. In FIG. 5K, the silicon dioxide layer 56 is etched using fluorocarbon plasma dry etch technology. In this case, line and space width is dependent on the required width. In FIG. 5L, the resist layer 56 is removed.

Although the present invention and its advantages have been described in detail, it should be understood that various changes, substitutions and alterations can be made herein without departing from the spirit and scope of the invention as defined by the appended claims.

What is claimed is:

1. A method for performing electron beam duplication lithography comprising the steps of:
   providing a first substrate with a field emitter deposited on the first substrate in a predefined pattern whereby an active field emission material is deposited on the first substrate in the predefined pattern on a permanent basis such that all of such field emission material emits electrons on a continuous basis when activated, and whereby no active field emission material resides in spaces between the predefined pattern so that no field emission of electrons occurs in such spaces;
   providing a second substrate positioned a distance from the first substrate with an electron beam resist layer deposited on the second substrate; and
   establishing an electric field to thereby cause an emission of electron beams from the active field emission material towards the electron beam resist layer in order to modify the electron beam resist layer in a pattern substantially identical to the predefined pattern.

2. The method as recited in claim 1, further comprising the step of positioning a magnetic field lens to focus the electron beams as they are emitted from the field emitter towards the electron beam resist layer.

3. The method as recited in claim 1, further comprising the step of positioning an electric field lens to focus the electron beams as they are emitted from the field emitter towards the electron beam resist layer.

4. The method as recited in claim 1, wherein a conductive layer is positioned between the first substrate and the field emitter.

5. The method as recited in claim 1, wherein a conductive layer is positioned between the second substrate and the electron beam resist layer.

6. The method as recited in claim 1, wherein when the electric field is established there is no de-activated field emission material.

7. The method as recited in claim 1, wherein it is not possible to de-activate selected portions of the field emission material.

8. The method as recited in claim 1, wherein de-activation of selected portions of the field emission material is not required to define the predefined pattern.

9. The method as recited in claim 1, wherein the field emitter is not matrix-addressable.

10. The method as recited in claim 1, wherein the electron beam resist layer is not modified in the spaces between the predefined pattern since no field emission of electrons occurs in such spaces.

* * * * *